(12) United States Patent
Yan

(10) Patent No.: US 6,641,959 B2
(45) Date of Patent: Nov. 4, 2003

(54) ABSORBERLESS PHASE-SHIFTING MASK FOR EUV

(75) Inventor: Pei-Yang Yan, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 209 days.

(21) Appl. No.: 09/927,100

(22) Filed: Aug. 9, 2001

(65) Prior Publication Data

US 2003/0031937 A1 Feb. 13, 2003

(51) Int. Cl.[7] .................................................. G03F 9/00
(52) U.S. Cl. ......................................................... 430/5
(58) Field of Search ....................... 430/5, 322; 378/34, 378/35

(56) References Cited

U.S. PATENT DOCUMENTS

| | | | | |
|---|---|---|---|---|
| 5,272,744 A | * | 12/1993 | Itou et al. | 378/35 |
| 5,328,784 A | * | 7/1994 | Fukuda | 430/5 |
| 6,178,221 B1 | * | 1/2001 | Levinson et al. | 378/35 |
| 6,392,792 B1 | * | 5/2002 | Naulleau | 359/360 |

\* cited by examiner

*Primary Examiner*—S. Rosasco
(74) *Attorney, Agent, or Firm*—George Chen

(57) ABSTRACT

The present invention discloses a mask having a substrate; a lower multilayer mirror disposed over the substrate, the lower multilayer mirror having a first region and a second region; a buffer layer disposed over the second region of the lower multilayer mirror; and an upper multilayer mirror disposed over the buffer layer. The present invention further discloses a method of forming such a mask.

22 Claims, 4 Drawing Sheets

FIG. 1a
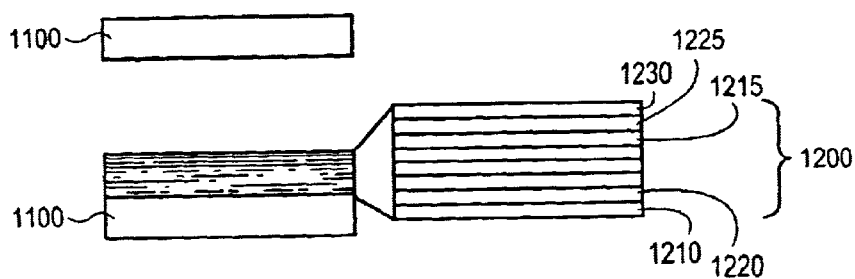
FIG. 1b
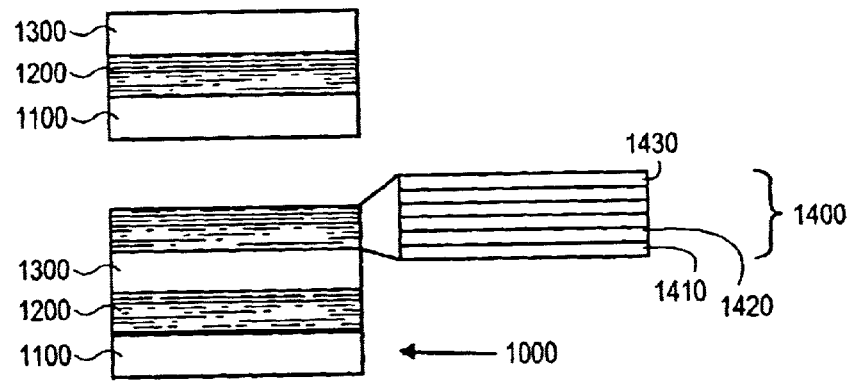
FIG. 1c
FIG. 1d
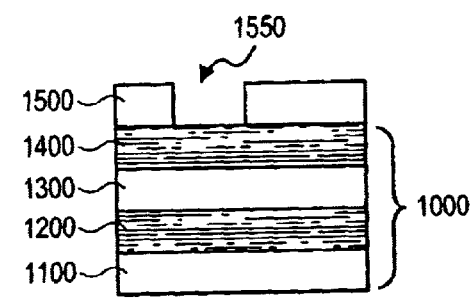
FIG. 1e
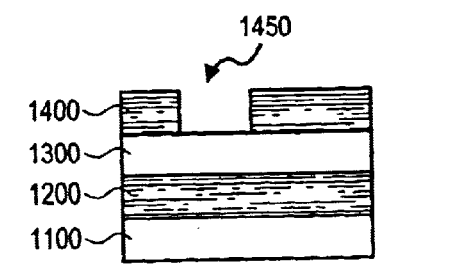
FIG. 1f
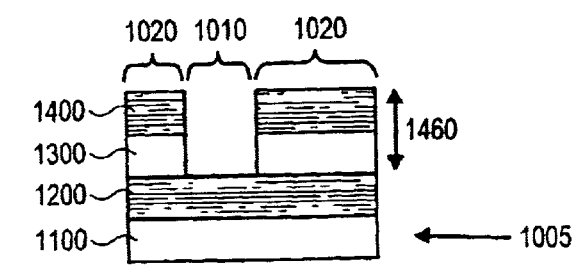
FIG. 1g

ABSORBERLESS PHASE-SHIFTING MASK FOR EUV

BACKGROUND OF THE INVENTION

1. Field of the Invention

The present invention relates to the field of semiconductor integrated circuit manufacturing, and more specifically, to an absorberless phase-shifting mask (PSM) for EUV and a method of fabricating such an EUV mask.

2. Discussion of Related Art

During the fabrication of integrated circuits (IC), a semiconductor wafer is subdivided into contiguous fields that are essentially identical. Each field typically includes one or more IC chips. A radiation-sensitive material, such as photoresist, is applied over the wafer. Then a wafer stepper with reduction projection optics scans radiation across a mask and onto each field sequentially to expose portions of the photoresist. The mask determines the pattern to be transferred onto the wafer through the processes of exposing, developing, and etching.

Improvements in lithography have increased the density and enhanced the performance of IC chips. According to the Rayleigh criterion, the critical dimension (CD) that may be resolved by a wafer stepper is directly proportional to the wavelength of the illumination and inversely proportional to the numerical aperture (NA) of the projection optics. For example, deep ultraviolet (DUV) lithography uses a wavelength of 157 nanometers (nm), 193 nm, or 248 nm and a NA of 0.45–0.80 to print a feature with a CD in the range of 70–180 nm.

A feature with an even smaller CD may be printed using next generation lithography (NGL), such as extreme ultraviolet (EUV) lithography. An EUV wafer stepper may use four imaging mirrors and an NA of 0.10 to achieve a CD of 50–70 nm with a depth of focus (DOF) of 1.00 micrometer (um). Alternatively, an EUV wafer stepper may use six imaging mirrors and an NA of 0.25 to print a CD of 20–30 nm although the DOF will be reduced to 0.17 um.

A binary mask only modulates the amplitude of the exposure light. Thus, diffraction will degrade the fidelity of the printed feature as the CD to be printed approaches the wavelength of the exposure light. However, a phase-shifting mask (PSM) modulates the phase of the exposure light, in addition to the amplitude of the exposure light. Consequently, a PSM can resolve a feature with a CD that is about the same size as or smaller than the wavelength of the exposure light.

Thus, what is needed is a method of creating an absorberless phase-shifting mask (PSM) for EUV and a method of fabricating such an EUV mask.

BRIEF DESCRIPTION OF THE DRAWINGS

FIGS. 1(a)–(g) are illustrations of a cross-sectional view of an embodiment of a method to form an absorberless phase-shifting mask for EUV according to the present invention.

DETAILED DESCRIPTION OF THE PRESENT INVENTION

Figure 2A:
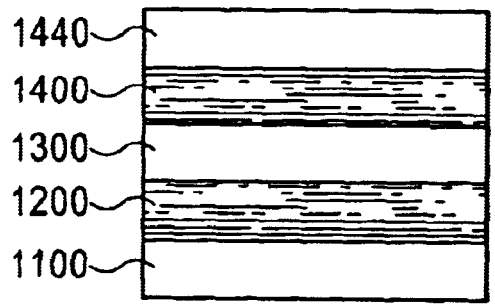
FIGS. 2(a)–(c) is an illustration of a cross-sectional view of an embodiment of a high contrast layer in an absorberless phase-shifting mask for EUV according to the present invention.

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

Extreme ultraviolet (EUV) light, having a wavelength in the range of about 11–15 nanometers (nm), may be used to expose a radiation-sensitive material, such as photoresist, that has been applied over a semiconductor wafer. Nearly all condensed materials are highly absorbing in EUV light so a reflective mask is usually necessary to define a desired pattern in the photoresist. More specifically, an EUV mask acts as a distributed Bragg reflector to achieve a peak reflectivity of about 60–75% at the centroid illumination wavelength of about 13.4 nm. The present invention includes an absorberless phase-shifting mask (PSM) for extreme ultraviolet (EUV) lithography, a method of fabricating such an EUV mask, and an apparatus that includes such an EUV mask.

A substrate 1100 is used as the starting material for an EUV mask of the present invention. An embodiment is shown in FIG. 1(a). The substrate 1100 has a low coefficient of thermal expansion (CTE), a smooth surface, and a low defect level. The substrate 1100 may be a glass-ceramic material.

A lower multilayer (ML) mirror 1200 is formed over the substrate 1100. An embodiment is shown in FIG. 1(b). In one embodiment, the lower ML mirror 1200 includes about 30–40 pairs of alternating layers of a high index of refraction material 1210 and a low index of refraction material 1220.

If the high index of refraction material 1215 in the topmost pair of the lower ML mirror 1200 is susceptible to oxidation by the environment, the thickness of the overlying low index of refraction material 1225 in the topmost pair of the lower ML mirror 1200 may be increased. Alternatively, a separate lower capping layer 1230, such as Ruthenium, may be used.

The high index of refraction material 1210 may include about 2.8 nm thick Molybdenum while the low index of refraction material 1220 may include about 4.1 nm thick Silicon. If needed, the Silicon 1225 in the topmost pair of the lower ML mirror 1200 may be increased, such as to about 11.0 nm. The high index of refraction material 1210 may also be formed from Beryllium, in which case, higher flux, and thus, higher wafer throughput, is available with a centroid illumination wavelength of about 11.0 nm.

The thickness uniformity of the lower ML mirror 1200 should be better than 0.8% across the substrate 1100. Direct current (DC) magnetron sputtering can deposit the lower ML mirror 1200 conformally with good thickness uniformity although a defect in the substrate 1100 will tend to propagate up through the alternating layers to the top surface of the lower ML mirror 1200. Alternatively, ion beam deposition (IBD) may be used to smooth over a defect in the substrate 1100 and prevent propagation of the defect to the top surface of the lower ML mirror 1200.

A buffer layer 1300 is formed over the top surface of the lower ML mirror 1200. An embodiment is shown in FIG. 1(c). The buffer layer 1300 typically has a thickness of about 7–105 nm. The buffer layer 1300 should be formed at a low process temperature, typically less than about 150 degrees C., so as to prevent interdiffusion of the alternating layers in the lower ML mirror 1200. For example, the buffer layer 1300 may be formed from a low temperature oxide (LTO) of silicon using radio frequency (RF) magnetron sputtering. Other materials, such as Silicon Oxynitride or Carbon, may also be used to form the buffer layer 1300.

An upper ML mirror 1400 is formed over the buffer layer 1300. An embodiment is shown in FIG. 1(d). The upper ML mirror 1400 includes about 10–25 pairs of alternating layers of a high index of refraction material 1410 and a low index of refraction material 1420.

If appropriate, the upper ML mirror 1400 may be formed from the same materials as the lower ML mirror 1200 for process simplicity. For example, the high index of refraction material 1410 may be formed from about 2.8 nm thick Molybdenum while the low index of refraction material 1420 may be formed from about 4.1 nm thick Silicon. In such an embodiment, the period of the upper ML mirror 1400 will also be about 6.9 nm. As needed, an upper capping layer 1430 may also be formed at the top surface of the upper ML mirror 1400 to prevent oxidation of Molybdenum.

Reflectivity of the lower ML mirror 1200 will tend to increase as the thickness, d, of the buffer layer 1300 decreases, but local maxima in reflectivity exist whenever the condition $d = m/(2n \cos \theta)$ is satisfied, where m is an integer, n is the real part of the refractive index of the buffer layer 1300, and theta is the angular deviation from normal of the light that is incident on the mask. Theta needs to be considered since an absorberless EUV mask is typically used with an incidence angle that is off-normal, such as 5 degrees away from normal.

For example, for a lower ML mirror 1200 having a period of about 6.9 nm, two possible thicknesses for a buffer layer 1300 formed from Silicon Dioxide are about 34.54 nm (for an integer multiple of 5) and about 69.08 nm (for an integer multiple of 10). Adjustments may have to be made to the thickness of the buffer layer 1300 to obtain the correct phase.

In another embodiment, the buffer layer 1300 may have a thickness of zero. In other words, the buffer layer 1300 may be absent. However, subsequent processing would become more complex due to the difficulty of precisely removing the upper ML mirror 1400 without a buffer layer 1300 to act as an etch stop over the lower ML mirror 1200.

The combination of upper ML mirror 1400, buffer layer 1300, lower ML mirror 1200, and substrate 1100 results in an absorberless EUV mask blank 1000. An embodiment is shown in FIG. 1(d).

Described next is the processing of an absorberless EUV mask blank 1000 to form an absorberless phase-shifting mask for EUV 1005, an embodiment being shown in FIG. 1(g).

An absorberless EUV mask blank 1000 is covered with a radiation-sensitive layer, such as photoresist 1500. The photoresist 1500 has a thickness of about 160–640 nm. A chemically-amplified resist (CAR) may be used. A pattern with a desired photoresist feature 1550 is formed in the photoresist 1500 by selective exposure with radiation, followed by a wet or dry develop process. The radiation may be provided by DUV light or an electron beam. An embodiment is shown in FIG. 1(e). After developing the pattern in the photoresist 1500, the critical dimension (CD) of the photoresist feature 1550 is measured with an optical tool or a scanning electron microscope (SEM).

Reactive ion etch (RIE) may be used in a reactor to transfer the photoresist feature 1550 into an etched feature 1450 in the upper ML mirror 1400. An embodiment is shown in FIG. 1(f). The upper ML mirror 1400 may be dry etched with a gas containing Chlorine, such as $Cl_2$ or $BCl_3$, or with a gas containing Fluorine, such as $NF_3$. Argon may be used as a carrier gas. In some cases, Oxygen may be included. The etch rate and the etch selectivity may be changed by modifying the configuration of the etch chamber in the reactor and adjusting parameters such as power, pressure, substrate temperature, and gas flowrate.

The buffer layer 1300 serves as an etch stop layer to help produce a good etch profile in the upper ML mirror 1400. Furthermore, the buffer layer 1300 protects the lower ML mirror 1200 from damage during etch of the upper ML mirror 1400.

After completing the etch, the photoresist 1500 is removed and the CD of the etched feature 1450 formed in the upper ML mirror 1400 is measured with an optical tool or a SEM. As appropriate, an interferometer may be used to determine the phase as well as the amplitude of the light signals.

The etched feature 1450 formed in the upper ML mirror 1400 is also inspected for defects. A microscope or an automated inspection tool may combine optical techniques with scanning of an EUV mask to acquire images. A laser producing UV/DUV light is usually used as the source of illumination. Typical wavelengths include, but are not limited to, 488 nm, 365 nm, 266 nm, 257 nm, 248 nm, 198 nm, and 193 nm. A shorter wavelength provides better resolution and may be a better predictor of the lithographic consequences of the defects that are found on the mask.

Figure 2B:
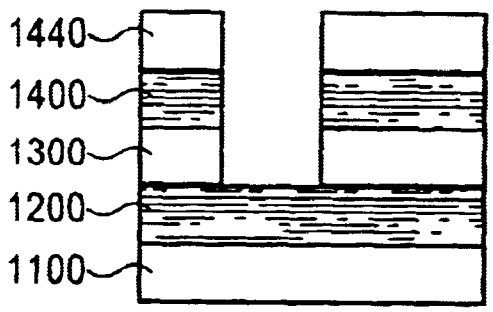

Defect inspection is generally performed by comparing two nominally identical patterns printed in different portions of an EUV mask (die-to-die) or comparing a pattern printed on the EUV mask and the corresponding layout data for the pattern (die-to-database). As needed, the contrast between the lower ML mirror 1200 and the upper ML mirror 1400 may be increased to enhance the inspection. In one embodiment shown in FIG. 2(a), a high contrast layer 1440 that appears dark at the inspection wavelength, such as Carbon, may be deposited over the upper ML mirror 1400 prior to patterning. The high contrast layer 1440 remains in place during patterning, etching, inspection, and repair. An embodiment is shown in FIG. 2(b).

Figure 2C:
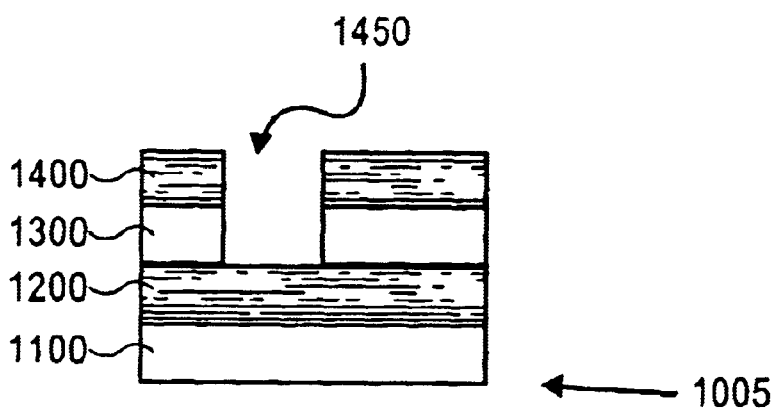

A focused ion beam (FIB) tool may be used to repair a defect found in the etched feature 1450 in the upper ML mirror 1400. The defect may be repaired by physical ion sputtering or by gas assisted etch (GAE) with ion bombardment. Bromine gas or Chlorine gas may be used for the GAE. The high contrast layer 1440 is removed after repair has been completed. An embodiment of an absorberless phase-shifting mask for EUV 1005 is shown in FIG. 2(c).

The buffer layer 1300 covers and protects the lower ML mirror 1200 from damage during repair of the defect in the upper ML mirror 1400. The thickness required for the buffer layer 1300 depends on the quantity of material that will be removed by the etch process and the repair process. Consequently, a high etch and repair selectivity, such as 5:1, allows the use of a buffer layer 1300 that is thin. A buffer layer 1300 that is thin decreases the chances of generating a printable soft defect during the removal of the buffer layer 1300 after completion of repair.

Allowing the buffer layer 1300 to remain over the lower ML mirror 1200 within the etched feature 1450 will increase light absorption when the EUV mask is used. The resulting reduction in contrast will slightly degrade CD control of a feature printed with the EUV mask. As a result, after repair has been completed, the buffer layer 1300 should be removed, wherever it is not covered by the upper ML mirror 1400. An embodiment is shown in FIG. 1(*g*). The upper ML mirror 1400 and the lower ML mirror 1200 must not be damaged when the exposed portions of the buffer layer 1300 are removed.

A buffer layer 1300 formed from Silicon Dioxide may be removed using a dry etch with a gas containing Fluorine, such as $CF_4$ or $C_4F_8$. In some cases, Oxygen and a carrier gas, such as Argon, may be included. Alternatively, a buffer layer 1300 may be removed using a wet etch if it is relatively thin since any undercut of the upper ML mirror 1400 would then be small. For example, a buffer layer 1300 formed from Silicon Dioxide may be etched with an aqueous solution of about 3–5% hydrofluoric acid. A combination of dry etch and wet etch may be used if desired.

The result of the process described above is an absorberless phase-shifting mask for EUV 1005 that includes an upper ML mirror 1400, a buffer layer 1300, a lower ML mirror 1200, and a substrate 1100. An embodiment is shown in FIG. 1(*g*). The absorberless phase-shifting mask for EUV 1005 has a lower reflective region 1010 and an upper reflective region 1020 that are separated vertically by a stack height 1460.

Figure 3:
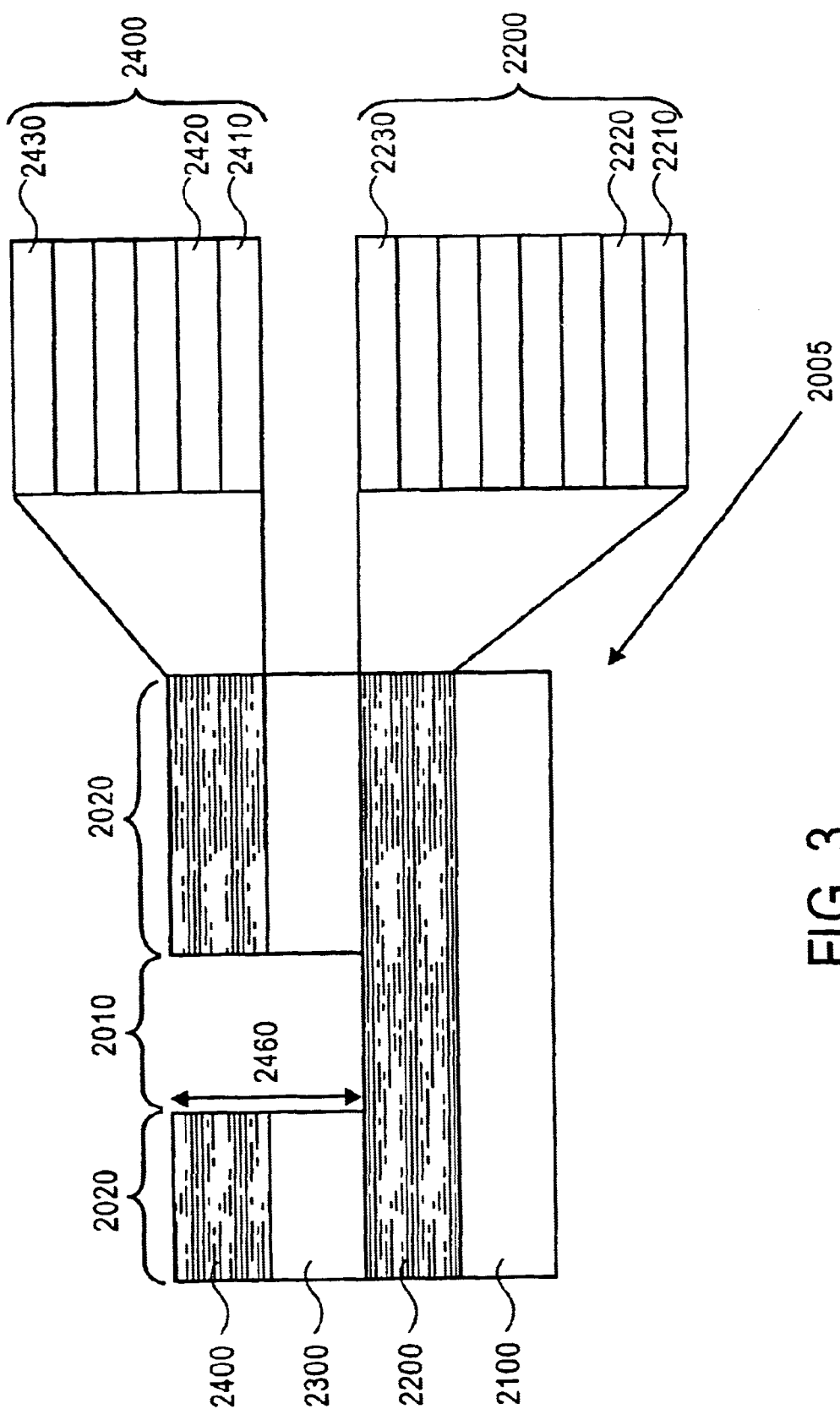
FIG. 3 is an illustration of a cross-sectional view of an embodiment of an absorberless phase-shifting mask for EUV according to the present invention.

Another embodiment of the present invention is an absorberless phase-shifting mask for EUV 2005 as shown in FIG. 3. The absorberless phase-shifting mask for EUV 2005 of the present invention includes a substrate 2100, such as a glass-ceramic material, that has a low coefficient of thermal expansion (CTE), a low defect level, and a smooth surface.

A lower ML mirror 2200 is disposed over the substrate 2100. The lower ML mirror 2200 has about 30–40 pairs of alternating layers of a high index of refraction material 2210 and a low index of refraction material 2220. The high index of refraction material 2210 may be about 2.8 nm thick Molybdenum while the low index of refraction material 2220 may be about 4.1 nm thick Silicon. In such an embodiment, the period of the lower ML mirror 2200 will be about 6.9 nm. As needed, a lower capping layer 2230, such as about 11.0 nm thick Silicon, may be disposed in the topmost pair of the lower ML mirror 2200 to prevent oxidation of Molybdenum.

A buffer layer 1300 is disposed over the lower ML mirror 1200. An embodiment is shown in FIG. 1(*c*). The buffer layer 2300 typically has a thickness of about 7–105 nm. The buffer layer 1300 may include Silicon Dioxide, such as a low temperature oxide (LTO). Alternatively, the buffer layer 2300 may include another material, such as Silicon Oxynitride, Ruthenium, or Carbon.

An upper ML mirror 2400 is disposed over the buffer layer 2300. The upper ML mirror 2400 includes about 10–25 pairs of alternating layers of a high index of refraction material 2410 and a low index of refraction material 2420. If desired, the upper ML mirror 2400 may include the same materials as the lower ML mirror 2200 for process simplicity. For example, the high index of refraction material 2410 may be about 2.8 nm thick Molybdenum while the low index of refraction material 2420 may be about 4.1 nm thick Silicon. In such an embodiment, the period of the upper ML mirror 2400 will be about 6.9 nm. As needed, an upper capping layer 2430, such as about 11.0 nm thick Silicon, may be disposed in the topmost pair of the upper ML mirror 2400 to prevent oxidation of Molybdenum.

The absorberless phase-shifting mask for EUV 2005 of the present invention includes an upper ML mirror 2400, a buffer layer 2300, a lower ML mirror 2200, and a substrate 2100, for which an embodiment is shown in FIG. 2. The absorberless phase-shifting mask for EUV 2005 has a lower reflective region 2010 and an upper reflective region 2020 that are separated vertically by a step height 2460. The lower reflective region 2010 includes the lower ML mirror 2200. The upper reflective region 2020 includes the upper ML mirror 2400. Contrast is enhanced when a phase shift of 180 degrees is introduced between the light reflected from the lower reflective region 2010 and the light reflected from the upper reflective region 2020. The destructive interference occurring at the boundary between the two regions minimizes the detrimental effects of diffraction on image fidelity and quality.

In one embodiment, the number of pairs of alternating layers in the lower ML mirror 2200 is adjusted to balance the light reflected off the lower reflective region 2010 with the light reflected off the upper reflective region 2020. It is desirable for the reflectivity of the lower reflective region 2010 to be similar to the reflectivity of the upper reflective region 2020. For example, the match should be about 4% or less for typical reflectivities of about 60–75% at a centroid illumination wavelength of about 13.4 nm.

In another embodiment, the thickness of the lower capping layer 2230 and the thickness of the upper capping layer 2430 are adjusted to balance the light reflected off the lower reflective region 2010 with the light reflected off the upper reflective region 2020. It is important to balance the light reflected off the lower reflective region 2010 with the light reflected off the upper reflective region 2020. Further compensation may be needed for this embodiment since adjusting the capping layer thickness also affects the phase of the reflected light. For example, compensation may be achieved by adjusting the thickness of the buffer layer 2300.

Reflectivity will tend to be higher when the buffer layer 2300 is thinner, with local maxima whenever the condition d=m/(2n cos theta) is satisfied, where m is an integer, n is the real part of the refractive index of the buffer layer 2300, and theta is the angular deviation from normal of the light that is incident on the mask. Theta should be considered since an absorberless EUV mask is typically used with an incidence angle that is off-normal, such as 5 degrees away from normal. For a lower ML mirror 2200 having a period of about 6.9 nm, two possible thicknesses for a buffer layer 2300 formed from Silicon Dioxide are 34.54 nm (for an integer multiple of 5) and 69.08 nm (for an integer multiple of 10).

In one embodiment, the buffer layer 2300 may have a thickness of zero. In other words, the buffer layer 2300 may be absent in an absorberless phase-shifting mask for EUV. However, the stack height 2460 would tend to be larger when the buffer layer 2300 is absent because the correct phase could only be obtained by choosing the appropriate number of pairs of a high index of refraction material 2410 and a low index of refraction material 2420 for the upper ML mirror 2400.

Figure 4:
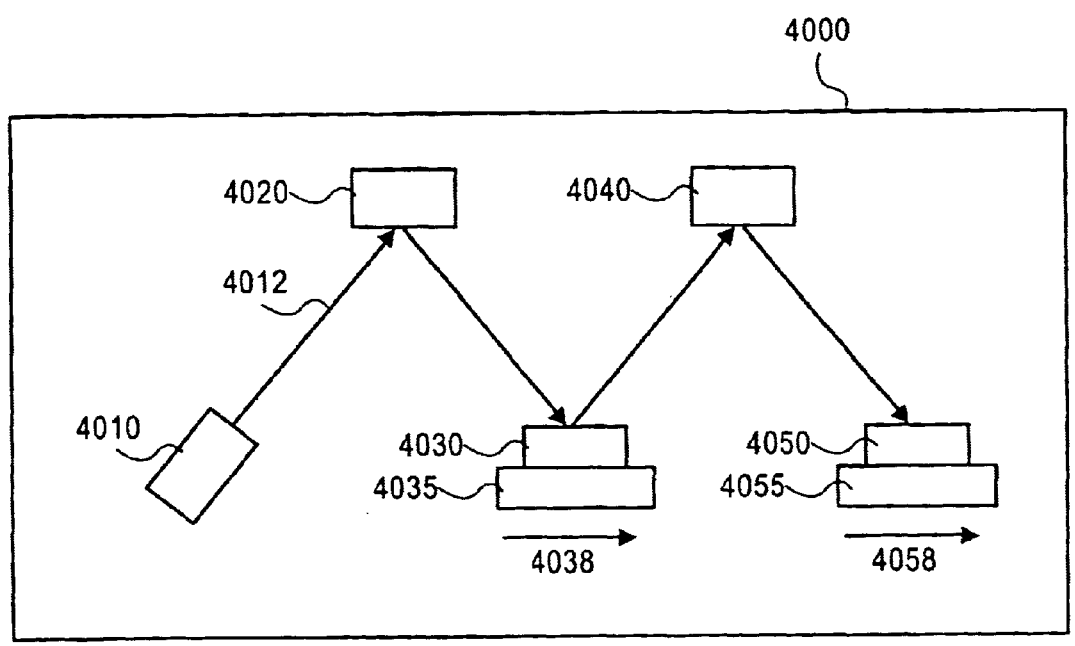
FIG. 4 is an illustration of a cross-sectional view of an embodiment of an apparatus that includes an absorberless phase-shifting mask according to the present invention.

The present invention also contemplates an apparatus, an embodiment being shown in FIG. 4, that includes an absorberless phase-shifting mask 4030. One embodiment is a wafer exposure tool 4000 that has an illumination system 4010 to provide radiation 4012; a condenser system 4020 to collect the radiation (provided by the illumination system 4010); an absorberless phase-shifting mask 4030 to reflect the radiation (collected by the condenser system 4020); an imaging system 4040 to project the radiation (reflected by the absorberless phase-shifting mask 4030); and a wafer 4050 to receive the radiation (projected by the imaging system 4040).

The radiation in the wafer exposure tool 4000 may include EUV light having wavelength in a range of 11–15 nm. In particular, EUV light may have a centroid illumination wavelength of about 13.4 nm.

In another embodiment, the wafer exposure tool 4000 includes a mask stage 4035 to scan the absorberless phase-shifting mask 4030 and a wafer stage 4055 to scan the wafer 4050. The mask stage 4035, traveling at a mask stage speed 4038, and the wafer stage 4055, traveling at a wafer stage speed 4058, are synchronized. The mask stage speed 4035 and the wafer stage speed 4058 may each vary during the scan so as to permit dynamic adjustment of the magnification in the scan direction.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

Thus, we have described an absorberless phase-shifting mask for EUV and a method of fabricating such an EUV mask.

I claim:

1. A method of forming an absorberless EUV mask comprising:
   providing a substrate;
   forming a lower multilayer mirror over said substrate;
   forming a buffer layer over said lower multilayer mirror;
   forming an upper multilayer mirror over said buffer layer;
   patterning said upper multilayer mirror into a first portion and a second portion;
   removing said upper multilayer mirror in said first portion; and
   removing said buffer layer in said first portion.

2. The method of claim 1 wherein said lower multilayer mirror comprises 30–40 pairs of alternating layers of a first material and a second material.

3. The method of claim 2 wherein said first material comprises a high index of refraction material and said second material comprises a low index of refraction material.

4. The method of claim 2 wherein said first material comprises Molybdenum.

5. The method of claim 2 wherein said second material comprises Silicon.

6. The method of claim 1 wherein said upper multilayer mirror comprises 10–25 pairs of alternating layers of a first material and a second material.

7. The method of claim 6 wherein said first material comprises a high index of refraction material and said second material comprises a low index of refraction material.

8. The method of claim 6 wherein said first material comprises Molybdenum.

9. The method of claim 6 wherein said second material comprises Silicon.

10. An absorberless EUV apparatus comprising:
    a substrate;
    a lower multilayer mirror disposed over said substrate, said lower multilayer mirror having a first region and a second region;
    a buffer layer disposed over said second region of said lower multilayer mirror; and
    an upper multilayer mirror disposed over said buffer layer.

11. The apparatus of claim 10 wherein said lower multilayer mirror comprises 30–40 pairs of alternating layers of a first material and a second material.

12. The apparatus of claim 11 wherein said first material comprises a high index of refraction material and said second material comprises a low index of refraction material.

13. The apparatus of claim 11 wherein said first material comprises Molybdenum.

14. The apparatus of claim 11 wherein said second material comprises Silicon.

15. The apparatus of claim 10 wherein said upper multilayer mirror comprises 10–25 pairs of alternating layers of a first material and a second material.

16. The apparatus of claim 15 wherein said first material comprises a high index of refraction material and said second material comprises a low index of refraction material.

17. The apparatus of claim 15 wherein said first material comprises Molybdenum.

18. The apparatus of claim 15 wherein said second material comprises Silicon.

19. The apparatus of claim 10 wherein a first reflectivity of said first region is approximately the same as a second reflectivity of said second region.

20. The apparatus of claim 19 wherein said first reflectivity and said second reflectivity are matched to about 4% or less.

21. An EUV apparatus comprising:
    an illumination system adapted to provide radiation;
    a condenser system adapted to collect said radiation provided by said illumination system;
    an absorberless phase-shifting mask adapted to reflect said radiation collected by said condenser systems,
    said absorberless phase-shifting mask comprising:
      a substrate:
      a lower multilayer mirror disposed over said substrate, said lower multilayer mirror having a first region and a second region;
      a buffer layer disposed over said second region of said lower multilayer mirror; and
      an upper multilayer mirror disposed over said buffer layer;
    an imaging system adapted to project said radiation reflected by said absorberless phase-shifting mask; and
    a wafer adapted to receive said radiation projected by said imaging system.

22. The apparatus of claim 21 further comprising a mask stage adapted to scan said absorberless phase-shifting mask and a wafer stage adapted to scan said wafer.

* * * * *